(12) United States Patent
Walker et al.

(10) Patent No.: US 11,595,229 B2
(45) Date of Patent: Feb. 28, 2023

(54) SUBSCRIBER STATION FOR A SERIAL BUS SYSTEM, AND METHOD FOR DATA TRANSMISSION IN A SERIAL BUS SYSTEM

(71) Applicant: Robert Bosch GmbH, Stuttgart (DE)

(72) Inventors: Steffen Walker, Reutlingen (DE); Jochen Huebl, Schwieberdingen (DE); Simon Weissenmayer, Flein (DE)

(73) Assignee: Robert Bosch GmbH, Stuttgart (DE)

( * ) Notice: Subject to any disclaimer, the term of this patent is extended or adjusted under 35 U.S.C. 154(b) by 278 days.

(21) Appl. No.: 16/976,779

(22) PCT Filed: Mar. 5, 2019

(86) PCT No.: PCT/EP2019/055363
§ 371 (c)(1),
(2) Date: Aug. 31, 2020

(87) PCT Pub. No.: WO2019/174958
PCT Pub. Date: Sep. 19, 2019

(65) Prior Publication Data
US 2021/0014080 A1 Jan. 14, 2021

(30) Foreign Application Priority Data

Mar. 12, 2018 (DE) .......................... 102018203705.1

(51) Int. Cl.
*H04L 12/40* (2006.01)
*G01R 19/00* (2006.01)
(Continued)

(52) U.S. Cl.
CPC .... *H04L 12/40013* (2013.01); *G01R 19/0084* (2013.01); *H04L 12/4013* (2013.01);
(Continued)

(58) Field of Classification Search
CPC ........... H04L 12/40013; H04L 12/4013; H04L 12/4015; H04L 25/0264; H04L 25/0328;
(Continued)

(56) References Cited

U.S. PATENT DOCUMENTS

| 2011/0188371 A1 | 8/2011 | Brunnberg et al. |
| 2015/0220401 A1* | 8/2015 | Jiang ......................... H04L 1/24 714/23 |
| 2016/0269225 A1* | 9/2016 | Kirchmeier ............. H04L 12/40 |

(Continued)

FOREIGN PATENT DOCUMENTS

| CN | 102223421 A | 10/2011 |
| CN | 102404320 A | 4/2012 |

(Continued)

OTHER PUBLICATIONS

International Search Report for PCT/EP2019/055363, dated May 14, 2019.

*Primary Examiner* — Ricky Q Ngo
*Assistant Examiner* — Stephen N Steiner
(74) *Attorney, Agent, or Firm* — Norton Rose Fulbright US LLP; Gerard Messina

(57) ABSTRACT

A subscriber station for a serial bus system. The subscriber station encompasses: a communication control device for controlling communication with at least one further subscriber station of the bus system; a transmission/reception device for receiving a message from a bus of the bus system, which message was created by the communication control device or by the at least one further subscriber station of the bus system and is being transferred on the bus; an interference detection unit that is configured to detect interference in the context of transfer of the message on the bus; and an interference processing unit that is configured to evaluate the interference detected by the interference detection unit in terms of the nature and magnitude of the interference, and to (Continued)

adapt communication control by the communication control device to the result of the evaluation of the interference.

12 Claims, 6 Drawing Sheets

(51) Int. Cl.
    *H04L 25/02*     (2006.01)
    *H04L 25/03*     (2006.01)
    *H04L 41/0654*     (2022.01)

(52) U.S. Cl.
    CPC ...... *H04L 12/4015* (2013.01); *H04L 25/0264* (2013.01); *H04L 25/0328* (2013.01); *H04L 41/0654* (2013.01); *H04L 2012/40215* (2013.01); *H04L 2012/40273* (2013.01)

(58) Field of Classification Search
    CPC ....... H04L 41/0654; H04L 2012/40215; H04L 2012/40273; G01R 19/0084
    See application file for complete search history.

(56) References Cited

U.S. PATENT DOCUMENTS

2017/0063571 A1\*   3/2017   Hehemann ............ H04L 12/413
2019/0047580 A1\*   2/2019   Kwasnick ............ G05D 1/0088

FOREIGN PATENT DOCUMENTS

| | | |
|---|---|---|
| CN | 103109478 A | 5/2013 |
| CN | 105684360 A | 6/2016 |
| DE | 102014204048 A1 | 9/2015 |
| JP | 2012109833 A | 6/2012 |
| JP | 2015220612 A | 12/2015 |
| JP | 2017118184 A | 6/2017 |

\* cited by examiner

SUBSCRIBER STATION FOR A SERIAL BUS SYSTEM, AND METHOD FOR DATA TRANSMISSION IN A SERIAL BUS SYSTEM

FIELD

The present invention relates to a subscriber station for a serial bus system and to a method for data transfer in a serial bus system, in which a diagnosis of interference in the bus system, for example with reference to EMC, is executable, and strategies at a system level are ascertained and applied.

BACKGROUND INFORMATION

CAN bus systems are used, for example in vehicles or in industrial facilities, for communication between control devices. In CAN bus systems, messages are transferred using the CAN and/or CAN FD protocol, as described in the current ISO 11898-1:2015 constituting the CAN protocol specification with CAN FD. Also known as a further variant of CAN or CAN FD is an LVCAN, in which the messages are transmitted at least in part at a transmission level, by the fact that the voltage supply is reduced as compared to the usual level of 5 V, in particular to 3.5 V.

Communication in the bus system generally proceeds in real time. This means that safety-relevant data, which may require a quick reaction by a control device or by actuators that are controlled by the control device, can also be sent over the bus system.

Interference in communications in the bus system can occur during operation of a vehicle or of an industrial facility, however, as a result of certain events. As a solution to this, errors in the context of transmission and reception are counted by the subscriber stations. In a CAN bus system, transmission errors have a greater weighting than reception errors.

If at least one error counter exceeds a value of 127, the subscriber station transitions into the Error Passive state. In the Error Passive state, errors are signaled only with a recessive level. In addition, the Error Passive subscriber station must observe an additional delay time of 8 bit times when transmitting messages. If the transmission error counter exceeds 255, a Bus Off state is initiated, in which the subscriber station cannot participate in bus events until the next reset.

In vehicles, connection of all devices to the Internet (IoT) is now being required. As a result, low-priority data are increasingly being transmitted via the bus of the CAN bus system so that those data can be evaluated at a later point in time.

It is problematic, however, that lower-priority data can also cause the error counters to increment, and thereby cause a subscriber station to transition more quickly into the Bus Off state. In addition, in conditions in which bandwidth must be limited, the low-priority data can jeopardize the real-time capability of the CAN bus system.

SUMMARY

An object of the present invention is to provide a subscriber station for a bus system, and a method for data transfer in a bus system, which solve the problems recited above. The present invention provides a subscriber station for a bus system, and a method for data transfer in a bus system, in which conditions that jeopardize the real-time capability of the CAN bus system can be detected more promptly and can be appropriately reacted to.

The object may be achieved by a subscriber station for a serial bus system in accordance with example embodiments of the present invention. In accordance with an example embodiment of the present invention, the subscriber station encompasses: a communication control device for controlling communication with at least one further subscriber station of the bus system; a transmission/reception device for receiving a message from a bus of the bus system, which message was created by the communication control device or by the at least one further subscriber station of the bus system and is being transferred on the bus; an interference detection unit that is configured to detect interference in the context of transfer of the message on the bus; and an interference processing unit that is configured to evaluate the interference detected by the interference detection unit in terms of the nature and magnitude of the interference, and to adapt communication control by the communication control device to the result of the evaluation of the interference.

Thanks to the measurement of the interference on the bus and compliance with electromagnetic compatibility (EMC) by the subscriber station, critical bus states caused, for instance, by radiation with reference to EMC can be detected and reacted to before the first interference occurs. The results of the measurement are usable, for example, for an early warning system, for instance in safety-critical systems such as a motor vehicle or in industrial facilities. Electromagnetic compatibility (EMC) determines the ability of the subscriber station not to interfere with other subscriber stations of the bus system as a result of undesired electrical or electromagnetic effects, or to be interfered with by other subscriber stations.

Interference can thus be detected more promptly with the example subscriber station. As a result thereof, the bus system is more robust with respect to short-term EMC interference, since communication can be better adapted to changes in environmental conditions. For that purpose, the subscriber station can modify communication strategies with other subscriber stations of the bus system, in particular with control devices, on the basis of the measurement results. If several control devices utilize this technique, or if one of the subscriber stations can detect interference separately for the individual subscriber stations, a localization of interference in the network is then possible. Optimum operation, and easier and more economical repair of the bus system, are thereby possible.

Advantageous further embodiments of the subscriber station in accordance with the present invention are described herein.

The interference processing unit is possibly configured to distinguish between external and internal interference with the transfer of the message on the bus.

In an example embodiment of the present invention, the interference detection unit can have an individual level monitoring module for monitoring individual levels of differential bus signals. Additionally or alternatively, the interference detection unit can have a differential voltage monitoring module for monitoring whether a differential voltage lies outside a predetermined range. Additionally or alternatively, the interference detection unit can have a common mode interference monitoring module for monitoring whether the average voltage of the differential bus signals deviates, more quickly than prespecified or for a prespecified time, from a prespecified value. Additionally or alternatively, the interference detection unit can have a band interference monitoring module for monitoring prespecified frequency ranges of the aforementioned signals.

It is possible in this context for the individual level monitoring module to be configured to monitor whether one of the levels is changing particularly quickly and/or is deviating for a longer time from a prespecified range; and/or the individual level monitoring module is configured to monitor whether one of the levels is sufficiently high that a limitation by internal protective diodes due to electrostatic discharge, or a high common mode caused by EMC incoupling, cannot be ruled out.

It is possible for the differential voltage monitoring module to be configured to monitor whether the signal of the differential voltage is changing unusually quickly or unusually slowly; and/or the differential voltage monitoring module is configured to monitor whether the signal of the differential voltage is moving, over a prespecified time, unusually close to a decision threshold, established in the transmission/reception device, with which the transmission/reception device is configured to decide whether the signal of the differential voltage corresponds to a recessive bus state or to a dominant bus state.

The band interference monitoring module possibly has a filter in order to pick out the specific frequency ranges, the filter being at least one bandpass and/or at least one high-frequency rectifier circuit, and the filter being connected at its output to at least one analog/digital converter. According to an example embodiment of the present invention, the interference processing unit can be configured to adapt communication control by the communication control device by way of at least one of the following actions, namely: reporting the interference with a message to at least one of the other subscriber stations in the bus system; and/or forgoing the transmission of lower-priority messages; and/or transmitting safety-relevant messages redundantly via a further communication channel or with a time offset; and/or adapting at least one bit timing parameter for the message depending on the detected interference; and/or not increasing the data rate after the arbitration phase for a CAN FD message, even though an error counter has not yet reached the threshold normally necessary therefor; and/or not reducing the maximum amplitude of the differential voltage for an LVCAN message and thus not increasing the data rate, even though an error counter has not yet reached the prespecified threshold therefor.

According to an exemplifying embodiment of the present invention, the interference processing unit is configured to report the interference with a message at least to a sensor that is connected to the subscriber station.

According to an exemplifying embodiment of the present invention, the subscriber station furthermore has an error counter that is configured to add up separately, for each subscriber station of the bus system, the at least one interference instance that is produced by transmission of the message with the transmission/reception device.

The subscriber station described above can be part of a bus system that furthermore encompasses a bus by way of which at least two subscriber stations are connected to one another in such a way that they can communicate with one another. The at least two subscriber stations can be configured to transmit data regarding the interference to a control center for use in a map that geographically depicts the EMC impact corresponding to the interference.

The object described above is also achieved by a method according an example embodiment of the present invention for data transfer in a serial bus system. According to an example embodiment of the present invention, in the method, at least two subscriber stations in the bus system are connected to one another via the bus in such a way that they can communicate with one another. The method has the steps of: serially receiving, with a transmission/reception device of one of the subscriber stations, a message from the bus which was created by a communication control device of the subscriber station or of the at least one further subscriber station of the bus system and is being transferred on the bus; detecting, with an interference detection unit, interference in the context of transfer of the message on the bus; evaluating, with an interference processing unit, the interference detected by the interference detection unit in terms of the nature and magnitude of the interference; and adapting communication control by the communication control device to the result of the evaluation of the interference.

The method offers the same advantages as those described above with regard to the subscriber station.

Further possible implementations of the present invention encompass combinations, including ones not explicitly recited, of features or embodiments described above or hereinafter with regard to the exemplifying embodiments. One skilled in the art will also add individual aspects, as improvements or supplements, to the respective basic form of the present invention, based on the present disclosure.

BRIEF DESCRIPTION OF THE DRAWINGS

The present invention is described in more detail below on the basis of exemplifying embodiments and with reference to the figure.

In the Figures, identical or functionally identical elements are labeled with the same reference characters unless otherwise indicated.

DETAILED DESCRIPTION OF EXAMPLE EMBODIMENTS

Figure 1:
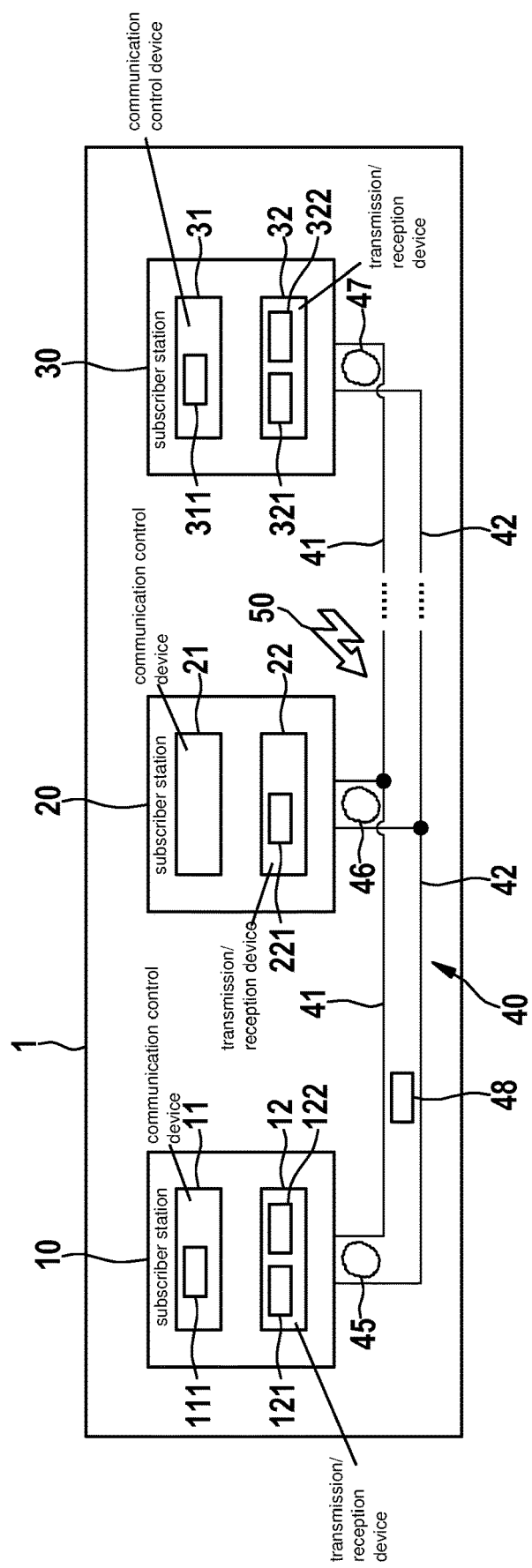
FIG. 1 is a simplified block diagram of a bus system according to a first exemplifying embodiment of the present invention.

FIG. 1 shows a bus system 1 for serial transfer of data. Bus system 1 is, for example, a CAN bus system and/or a CAN FD bus system and/or an LVCAN bus system, etc. Bus system 1 can be utilized in a vehicle, in particular a motor vehicle, an aircraft, etc., or in a hospital, etc. Bus system 1 is not limited, however, to the aforementioned variants of CAN-based systems.

In FIG. 1, bus system 1 has a plurality of subscriber stations 10, 20, 30 that are each connected to a bus 40 having a first bus wire 41 and a second bus wire 42. Bus wires 41, 42 can also be referred to as CAN_H and CAN_L, and serve to couple in the dominant level in the transmitting state. Messages 45, 46, 47, in the form of signals, are transferrable via bus 40 between the individual subscriber stations 10, 20, 30. Data that are to be transferred from one of subscriber stations 10, 20, 30 to at least one other of subscriber stations 10, 20, 30 can thereby be converted into signals on bus 40. Message 45 is, for example, a message having a normal priority. Message 46 is, for example, a message having a low priority, also referred to as a "low-priority" message. Message 47 is, for example, a message having a high safety relevance or a high priority, which is also referred to as a "high-priority" message. If one of subscriber stations 10, 20, 30 detects an error in the communication on bus 40, that subscriber station 10, 20, 30 transmits onto bus 40 an error message 48 that is received by the other subscriber stations 10, 20, 30. The error can occur, for example, as a result of interference 50 in the transfer of one of messages 45, 46, 47 on bus 40.

Subscriber stations 10, 20, 30 are, for example, control devices or indicating apparatuses or sensors or actuators of a motor vehicle or of an industrial facility or the like.

As shown in FIG. 1, subscriber station 10 has a communication control device 11 that has an interference processing unit 111, and a transmission/reception device 12 that has an error counter 121 and an interference detection unit 122. Subscriber station 20 has a communication control device 21 and a transmission/reception device 22 having a fault counter 221. Subscriber station 30 has a communication control device 31 that has an interference processing unit 311, and a transmission/reception device 32 having an error counter 321 and an interference detection unit 322.

Transmission/reception devices 12, 22, 32 of subscriber stations 10, 20, 30 are each directly connected to bus 40, although this is not depicted in FIG. 1.

Communication control devices 11, 21, 31 respectively serve to control communication by the respective subscriber station 10, 20, 30 via bus 40 with another subscriber station of subscriber stations 10, 20, 30 connected to bus 40. Communication control devices 11, 31 can be embodied, except for interference processing units 111, 311, like a conventional CAN controller and/or CAN FD controller and/or LVCAN controller. Communication control device 21 can be embodied like a conventional CAN controller and/or CAN FD controller and/or LVCAN controller.

Transmission/reception devices 12, 32 serve to transmit the respective messages 45, 46, 47. Transmission/reception device 22 likewise serves to transmit one of messages 45, 46, 47. Error counters 121, 221, 321 serve to count the errors that the pertinent transmission/reception device 12, 22, 32 has detected in the context of communication on bus 40. Except for the functions described below as being different for transmission/reception devices 12, 32, transmission/reception devices 12, 22, 32 can otherwise be configured like a conventional CAN transceiver and/or CAN FD transceiver and/or LVCAN transceiver.

Figure 2:
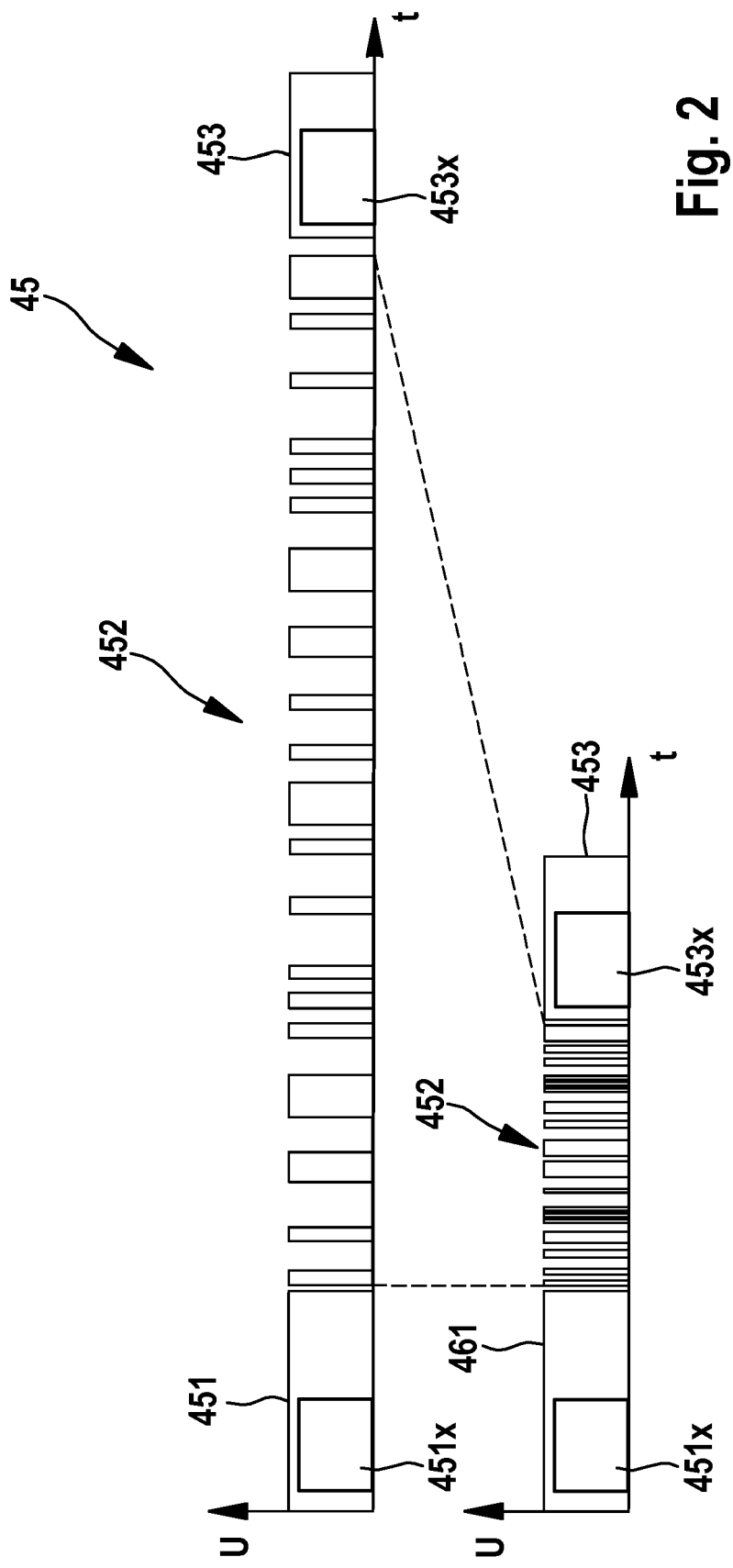
FIG. 2 is a diagram to illustrate a structure of messages that can be transmitted by a subscriber station of the bus system, according to the first exemplifying embodiment of the present invention.

As shown in FIG. 2 in each case as a voltage U over time t with reference to message 45, for a CAN frame at the top in FIG. 2 and for a CAN FD frame at the bottom in FIG. 2, CAN communication on bus 40 can be subdivided in principle into two different time segments. Messages 46, 47 can be constructed in the same manner.

The two different time segments of message 45 encompass arbitration phases 451, 453 (depicted merely schematically) and a data region 452, which in CAN FD can also be called a "data phase" and in which the useful data of message 45 are transmitted. In CAN FD, as compared with conventional CAN, at the end of the arbitration phase the data rate for the subsequent data phase is increased, for instance, to 2, 4, 8 Mbps. It is thus the case that with CAN FD, the data rate in arbitration phases 451, 453 is lower or faster than the data rate in data region 452. With CAN FD, data region 452 is considerably shortened as compared with data region 452 of the CAN frame.

In arbitration phase 451, 453, a determination is made with the aid of an identification number 451$x$, 453$x$ as to which of the currently transmitting subscriber station(s) 10, 20, 30 of bus system 1 at least temporarily gets exclusive, collision-free access to bus 40 of bus system 1 in the subsequent data region 452. A transfer of the useful data of message 45 by the subscriber station that has won the arbitration takes place in data region 452.

Figure 3:
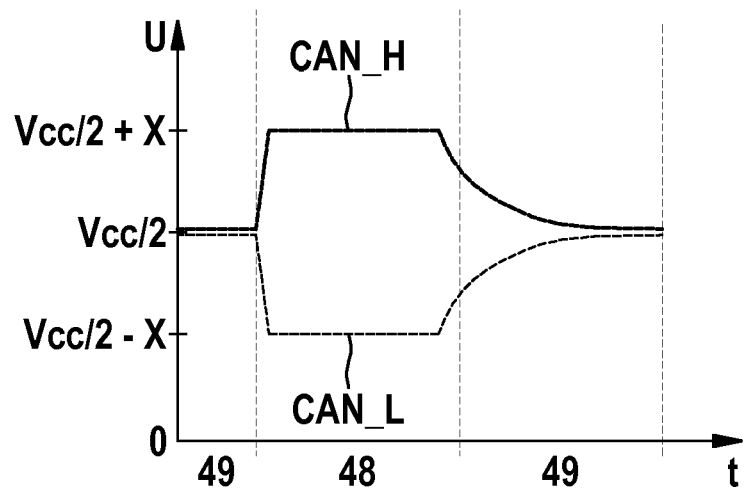
FIG. 3 depicts an example of a voltage curve over time of differential bus signals, for a message that is transmitted on a bus of the bus system according to the first exemplifying embodiment of the present invention.

FIG. 3 shows, as an example, voltage curves over time t for bus signals CAN_H, CAN_L. The voltage curves can occur during normal operation, i.e., with no interference 50 on bus 40, in a signal of messages 45, 46, 47. A sequence of a recessive bus level 49, a dominant bus level 48, and a recessive bus level 49 is shown as an example. The voltage curves of bus signals CAN_H and CAN_L show a considerably slower change of state upon a transition from a dominant bus level 48 to a recessive bus level 49 than upon a change from recessive bus level 49 to dominant bus level 48. With CAN FD, the length over time of dominant bus level 48 and of recessive bus level 49 is shorter in the data phase than in the arbitration phase, as is also evident from FIG. 2 and the description thereof.

According to FIG. 3, the bus signal CAN_H normally (i.e. with no interference 50 on bus 40, and for a CAN voltage supply Vcc=5 V) has levels between 2.5 V and 3.5 V, which corresponds to levels between Vcc/2 and Vcc/2+X. Conversely, the bus signal CAN_L normally (i.e. with no interference 50 on bus 40, and with a CAN voltage supply of 5 V) has levels between 1.5 V and 2.5 V, which corresponds to levels between Vcc/2−X and Vcc/2. The levels for CAN_H and CAN_L are correspondingly reduced for LVCAN, with a CAN voltage supply of, for example, 3.5 V.

Figure 4:
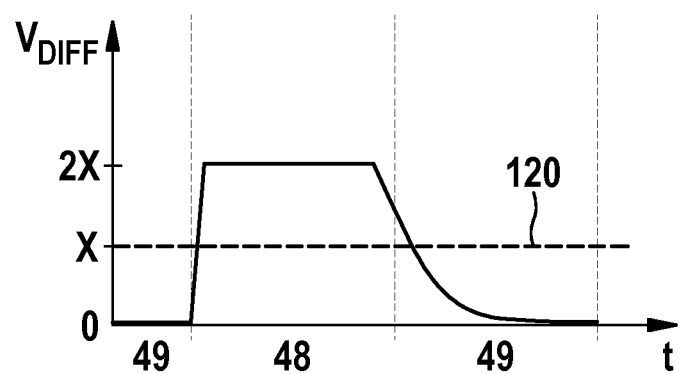
FIG. 4 depicts a voltage curve of the differential voltage that results from the voltage curve over time of the differential bus signals of FIG. 2.

As shown in FIG. 4, a differential voltage $V_{DIFF}$=CAN_H−CAN_L, resulting from the bus signals CAN_H, CAN_L, therefore normally has levels between 0 V and 2 V, for a CAN voltage supply of 5 V and if no interference 50 is occurring on bus 40. This corresponds to levels of the voltage $V_{DIFF}$ of between 0 V and 2X V. If the differential voltage $V_{DIFF}$ falls below a decision threshold of 1 V or X V, transmission/reception device 12 detects a recessive bus signal level. If the differential voltage $V_{DIFF}$ exceeds decision threshold 120 of 1 V or X V, transmission/reception device 12 detects a dominant bus signal level. Decision threshold 120 is correspondingly reduced with a CAN voltage supply of, for example, 3.5 V for LVCAN, in particular to 0.5 V, 0.4 V, 0.2 V, etc.

If interference 50 occurs on bus 40, the bus signals CAN_H, CAN_L, and thus also the differential voltage $V_{DIFF}$, change over time t as compared with the normal or expected (and thus prespecified) signal curves shown in FIG. 3 and FIG. 4. Those changes are detected by interference detection unit 122, as described below.

Figure 5:
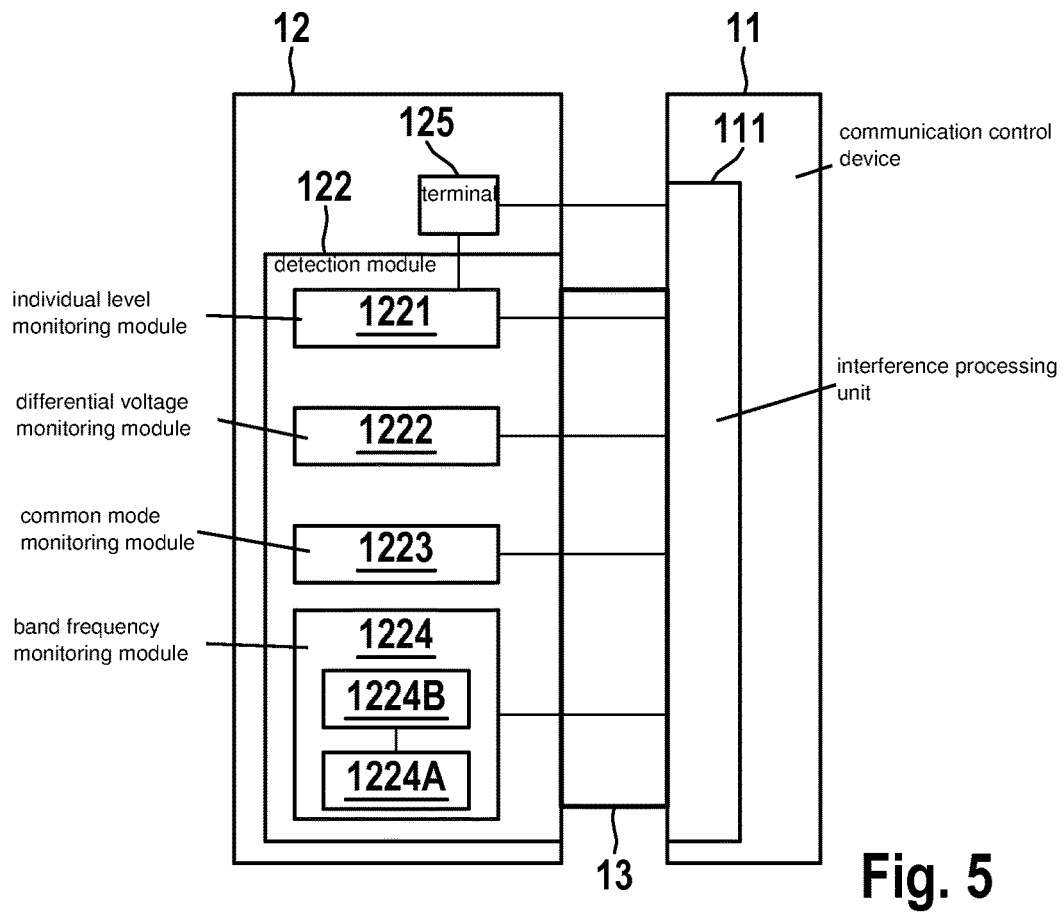
FIG. 5 is a simplified block diagram with an interference monitoring unit of a subscriber station of the bus system according to the first exemplifying embodiment of the present invention.

FIG. 5 shows, in more detail, interference detection unit 122, which is constructed identically to interference detection unit 322. Interference detection unit 122 has at least one of the following modules 1221 to 1224 for monitoring and detecting different interference instances 50 that can occur during the operation of bus system 1, namely an individual level monitoring module 1221 and/or a differential voltage monitoring module 1222 and/or a common mode interference monitoring module 1223 and/or a band interference monitoring module 1224. Interference detection module 122 is connected via an interface 13 and/or at least one terminal 125 to interference processing unit 111.

Individual level monitoring module 1221 monitors the individual levels of bus signals CAN_H, CAN_L, monitoring whether one of the levels is changing particularly quickly, in particular whether the edge slope at a transition between states 49, 48 is greater than normal, as shown in FIG. 3. Additionally or alternatively, it is possible to monitor whether one of the levels is deviating to an unusual degree from the usual or prespecified range, namely from the prespecified range from 2.5 V to 3.5 V for CAN_H and from the prespecified range from 1.5 to 2.5 V for CAN_L. Additionally or alternatively, monitoring occurs as to whether one of the levels is sufficiently high that a limitation by internal protective diodes, e.g. ≈+−58 V, due to electrostatic discharge, or a high common mode caused by EMC incoupling, cannot be ruled out.

Differential voltage monitoring module 1222 monitors whether or not differential interference 50 is present. What is monitored here is whether the signal of the differential voltage $V_{DIFF}$ lies outside the expected or prespecified range from 0 V to 2 V, as shown in FIG. 4. Additionally or alternatively, monitoring occurs as to whether the signal of the differential voltage $V_{DIFF}$ is changing unusually quickly or unusually slowly. "Unusually quickly" means in particular that the transition between the individual bus states 48, 49 or 49, 48 takes place more quickly than in the context of a normally long (and thus prespecified) bit duration, as shown in FIG. 4. "Unusually slowly" means in particular that the transition between the individual bus states 48, 49 or 49, 48 takes place more slowly than in the context of a normally long (and thus prespecified) bit duration, as shown in FIG. 4.

Additionally or alternatively, what is monitored is whether the signal of the differential voltage $V_{DIFF}$ moves, over a longer period of time, unusually close to decision threshold 120 of 1 V, as shown in FIG. 4. What is monitored in particular is therefore whether the signal of the differential voltage $V_{DIFF}$ is approximately equal to decision threshold 120 of 1 V for longer than a prespecified time.

Common mode monitoring module 1223 monitors whether the average voltage of the two signals CAN_H, CAN_L deviates particularly quickly, or particularly strongly over a longer period of time, from the expected value of 2.5 volts (the common mode signal). "Particularly quickly or over a longer period of time" means in particular that the edge slope of the signals CAN_H, CAN_L upon transitions between bus states 49, 48 is steeper than the prespecified value shown in FIG. 3 as a normal curve, or upon transitions between bus states 48, 49 is flatter than the prespecified value shown in FIG. 3 as a normal curve.

Band interference monitoring module 1224 monitors at least one prespecified frequency range of at least one of the aforementioned signals, namely the individual signal (CAN_H, CAN_L), differential signal ($V_{DIFF}$), and common mode signal. For this, the at least one prespecified frequency range is picked out by way of a filter 1224A, and the output signal of filter 1224A, which corresponds to the at least one prespecified frequency range, is conveyed to at least one analog/digital converter 1224B. Filter 1224A can be embodied as at least one bandpass and/or as at least one HF rectifier circuit.

Interference detection unit 122 of transmission/reception device 12, more precisely its modules 1221 to 1224, measure the respective interference instances 50 present on bus 40 and report to communication control device 11 regarding the nature and magnitude of interference 50. More precisely, the report is made from interference detection unit 122 to interference processing unit 111. Interference processing unit 111 is constructed identically to interference processing unit 311.

The report from transmission/reception device 12 to communication control device 11, or from unit 122 to unit 111, either can occur by way of data interface 13 that may already be present, for example SPI, I²C, etc., and/or can be effected using additional special terminals 125 on transmission/reception device 12, for instance digital-signal, PWM, SENT, analog, etc., as illustrated in FIG. 5 as a special example.

As a reaction to the report from transmission/reception device 12 as to which interference instances 50 are currently present on bus 40, and at what magnitude, communication control device 11, in particular its interference processing unit 111, can adjust its communication appropriately. For that purpose, communication control device 11 can take at least one of the following actions to control its communication, namely:

report the at least one detected interference instance 50 to the other subscriber stations 20, 30 in bus system 1; and/or
  forgo transmission of low-priority messages; and/or
  transmit safety-relevant messages redundantly via a further communication channel or with a time offset; and/or
  adapt the bit timing parameters, for example bit rate prescaler, sample point, synchronization jump width, etc. depending on the at least one detected interference instance 50; and/or
  for CAN FD: not increase the data rate after arbitration, even though error counter 121 has not yet reached the threshold normally necessary therefor; and/or
  for LVCAN: not reduce the magnitude of the voltage supply and thus the maximum amplitude of the differential voltage $V_{DIFF}$, and not increase the data rate, even though error counter 121 has not yet reached the threshold normally necessary therefor.

Using the report from transmission/reception device 12, communication control device 11, or more precisely its interference processing unit 111, can distinguish between external interference 50 and internal interference 50, since external interference 50 occurs upon both transmission and reception of the signals, but internal interference 50 occurs principally upon transmission of the signals. The distinction between external and internal interference 50 is important for service personnel, since in the context of an attempt to eliminate interference 50 in bus system 1, that distinction allows quicker isolation of the cause of interference, and quicker elimination of the fault responsible for interference 50.

With subscriber stations 10, 30, interference 50 can thus be detected more promptly. As a consequence thereof, bus system 1 is more robust with respect to short-term interference 50, in particular EMC interference, since communication can be better adapted to changes in environmental conditions, as described above. This makes possible optimal operation and, in the context of reporting of interference 50 between subscriber stations 10, 30, easier and more economical repair of bus system 1.

According to a modification of the above-described exemplifying embodiment of the present invention, it is possible for at least one subscriber station of subscriber stations 10, 20, 30 to know which messages 45, 46, 47 are being transmitted by which subscriber station 10, 20, 30. In this case that at least one subscriber station 10, 20, 30 can, while messages 45, 46, 47 are being received, add up separately for each individual subscriber station 10, 20, 30, for example using a plurality of counting units of error counter 121, the interference instance(s) 50 caused by transmission, and can store them for later readout by service personnel. This additionally facilitates troubleshooting. Storage can be accomplished, for example, with the aid of a memory function of interference processing device 111.

Figure 6:
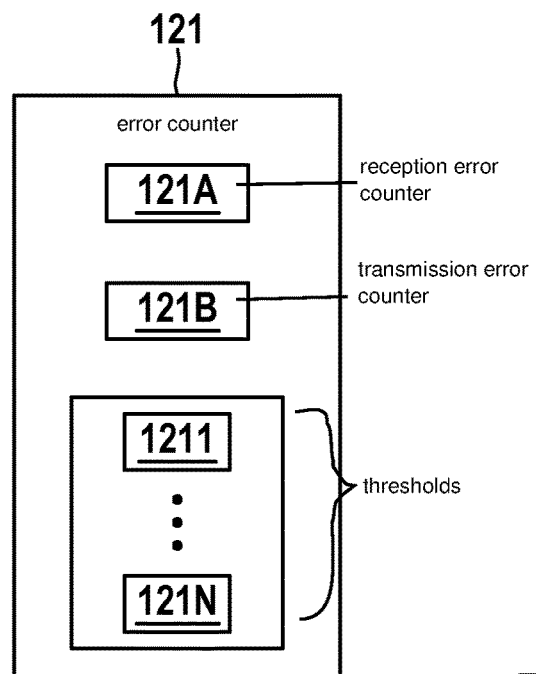
FIG. 6 is a simplified block diagram of an error counter of a subscriber station of the bus system according to a second exemplifying embodiment of the present invention.

FIG. 6 shows error counter 121 in more detail in order to explain a second exemplifying embodiment of the present invention. In the second exemplifying embodiment, the counting procedures for reception error counter 121A and transmission error counter 121B of error counter 121 are adapted as follows:

In order to detect and process interference 50 that causes a reception error, reception error counter 121A is, as before, incremented by 1 for each detected reception error. If, however, subscriber station 10 is the first of all the subscriber stations 10, 20, 30 to detect the reception error or interference 50, reception error counter 121A is incremented by a further 8, only at subscriber station 10, if the detected interference instance(s) 50 during reception were small. The larger the interference instances 50 during reception, the less the additional incrementing of reception error counter 121A.

Transmission error counter 121B is furthermore incremented by at least 1 for each detected transmission error. In addition, transmission error counter 121B is incremented by further points the smaller the interference instances 50 before or after transmission of the message (end-of-frame or interframe space, error delimiter), and by that many further points, the larger the interference instance(s) 50 during transmission.

Very generally, reception error counter 121A and transmission error counter 121B are incremented or decremented depending on the nature of the interference and/or the time of occurrence in the context of transmission of one of messages 45, 46, 47 via bus 40.

In general, what is to be detected on the basis of error counters 121A, 121B and corresponding error counters of subscriber station 30 is how well or how poorly subscriber station 10, 30 can receive under good EMC conditions. If the EMC conditions are poor, however, it is to be expected that subscriber station 10, 30 will receive many messages 45, 46, 47 erroneously, with no need for that to necessarily indicate a defect in transmission/reception device 12, 32. Error counter 121 and/or error counters 121A, 121B, and the corresponding error counters of subscriber station 30, are therefore not incremented as quickly under poor EMC conditions as under good EMC conditions.

Additionally or alternatively, thresholds 1211 to 121N for error states can be adapted. For example, thresholds 1211 to 121N for the transition to the Error Passive state and/or to the Bus Off state can be increased if interference 50 has been detected for a longer period of time between the transmission of messages 45 (end-of-frame or interframe space, error delimiter).

Figure 7:
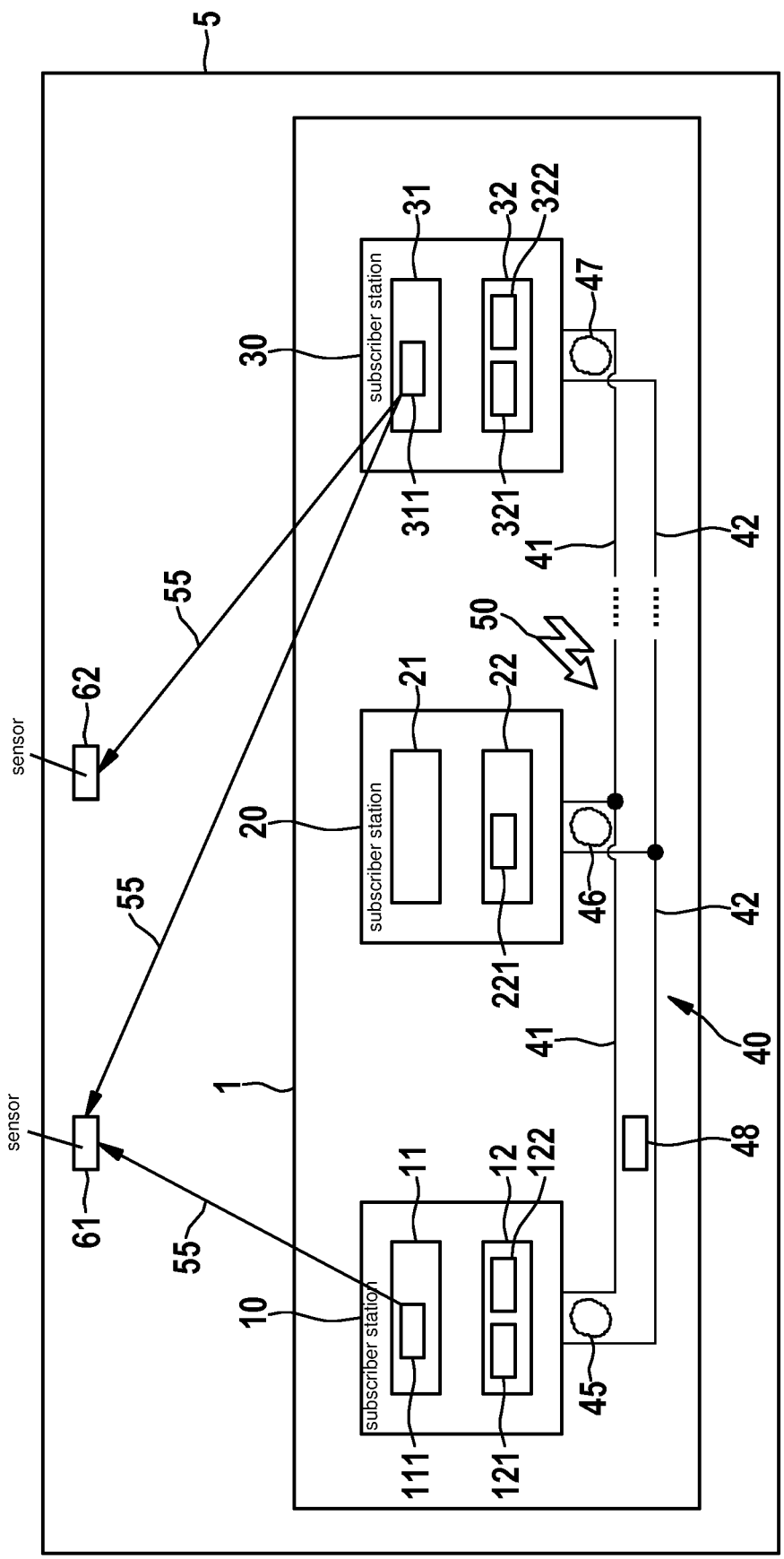
FIG. 7 is a simplified block diagram of a bus system having a system according to a third exemplifying embodiment of the present invention.

FIG. 7 shows a system 5 according to a third exemplifying embodiment of the present invention. In system 5, a message 55 is created and transmitted, using interference elimination modules 111, 311, as an advance warning for other sensors 61, 62, taking into account the fact that the conditions with regard to electromagnetic compatibility (EMC) usually act not only on bus system 1 but also on the sensor system. Alternatively or in addition to the advance warning by way of message 55, a lowering of the confidence index is possible in specific sensor data that are present in the context of interference 50 on bus 40, and that can therefore be negatively affected, in particular distorted or destroyed, by bus interference 50.

Figure 8:
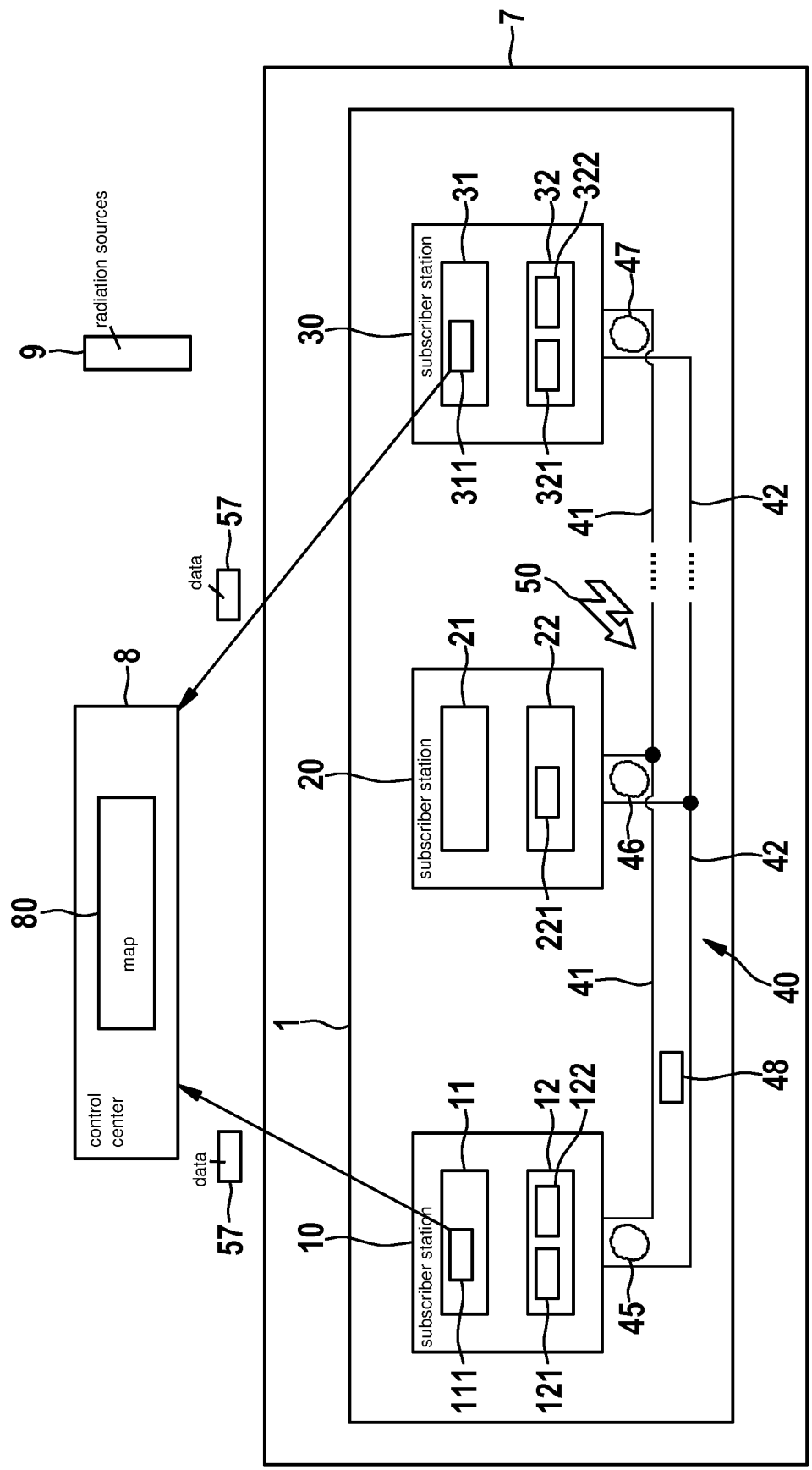
FIG. 8 is a simplified block diagram of a bus system having a system according to a fourth exemplifying embodiment of the present invention.

FIG. 8 shows a system 7 having a control center 8, according to a fourth embodiment of the present invention. Here at least one system 7, which can be in particular a vehicle, a tool, etc. having GPS reception, transmits the EMC irradiation from radiation sources 9, for example high-voltage pylons, neon lamp ballasts, etc., to control center 8, which is in particular a cloud, a traffic control center, etc. A geographic map 80 with EMC impact can then be created at control center 8.

This makes possible even earlier interventions by bus system 1. It is possible, for example, for (an) occupant(s) of autonomous vehicles, constituting system 7, to be prompted in timely fashion to take control of the vehicle themselves in advance of locations having elevated EMC irradiation (such as radiation sources 9).

All the above-described embodiments of bus system 1, of systems 5, 7, of subscriber stations 10, 20, 30, and of the method can be utilized individually or in all possible combinations. In particular, all features of the above-described exemplifying embodiments and/or modifications thereof can be combined or omitted in any way. The following modifications, in particular, are possible:

The above-described bus system 1 according to the exemplifying embodiments is described with reference to a bus system based on the CAN protocol or CAN FD protocol. Bus system 1 according to the various exemplifying embodiments can, however, also be another type of communication network. It is advantageous, but not an obligatory prerequisite, that in the context of bus system 1, exclusive, collision-free access by a subscriber station 10, 20, 30 onto bus 40 is guaranteed at least for specific time spans.

Bus system 1 according to the exemplifying embodiments is, in particular, a CAN network or a CAN FD network or a FlexRay network or an SPI network.

It is possible for one of the two bus wires 41, 42 to be connected to ground and thus to be a ground wire, and for the other of the two bus wires 41, 42 to be a signal wire on which the bus signal for messages 45, 46, 47 is transferred.

The number and disposition of subscriber stations 10, 20, 30 in bus system 1 according to the exemplifying embodiments is arbitrary. In particular, only subscriber stations 10 or subscriber stations 30 can be present in bus systems 1 of the exemplifying embodiments.

The functionality of the above-described exemplifying embodiments can be implemented not only as described above. Additionally or alternatively, the functionality can be integrated into existing products, for example into one of communication control devices 11, 31 or into one of transmission/reception devices 12, 32. It is possible in particular for the functionality in question to be implemented as a separate electronic module (chip), or to be embedded in an integrated total solution in which only one electronic module (chip) is present for communication control device 11, transmission/reception device 12, and the functionality of units 111, 122 and/or of counters 121.

What is claimed is:

1. A subscriber station for a serial bus system, comprising:
   a communication control device configured to control communication with at least one further subscriber station of the bus system;
   a transmission/reception device configured to receive a message from a bus of the bus system, the message having been created by the communication control device or by the at least one further subscriber station of the bus system and is being transferred on the bus;
   an interference detection unit configured to detect interference in the context of transfer of the message on the bus; and
   an interference processing unit configured to evaluate the interference detected by the interference detection unit in terms of nature and magnitude of the interference, and to adapt communication control by the communication control device based on a result of the evaluation of the interference, wherein the subscriber station and the further subscriber station are configured to transmit data regarding the interference to a control center for use in a map that geographically depicts an EMC impact corresponding to the interference.

2. The subscriber station as recited in claim 1, wherein the interference processing unit is configured to distinguish between external and internal interference with the transfer of the message on the bus.

3. The subscriber station as recited in claim 1, wherein the interference detection unit includes:
   an individual level monitoring module configured to monitor individual levels of differential bus signals; and/or
   a differential voltage monitoring module configured to monitor whether a differential voltage lies outside a predetermined range; and/or
   a common mode interference monitoring module configured to monitor whether an average voltage of the differential bus signals deviates, more quickly than prespecified or for a prespecified time, from a prespecified value; and/or
   a band interference monitoring module configured to monitor prespecified frequency ranges of the differential bus signals.

4. The subscriber station as recited in claim 3, wherein: (i) the individual level monitoring module is configured to monitor whether one of the individual levels is changing and/or is deviating for a longer time from a prespecified range, and/or (ii) the individual level monitoring module is configured to monitor whether one of the individual levels is at a magnitude that a limitation by internal protective diodes due to electrostatic discharge, or a common mode caused by EMC incoupling, is possible occur.

5. The subscriber station as recited in claim 3, wherein: (i) the differential voltage monitoring module is configured to monitor whether a signal of the differential voltage ($V_{DIFF}$) is changing above a first rate of change or below a second rate of change, and/or (ii) the differential voltage monitoring module is configured to monitor whether the signal of the differential voltage is moving, over a prespecified time, within a particular magnitude close to a decision threshold, established in the transmission/reception device, with which the transmission/reception device is configured to decide whether the signal of the differential voltage corresponds to a recessive bus state or to a dominant bus state.

6. The subscriber station as recited in claim 3, wherein the band interference monitoring module has a filter to pick out the prespecified frequency ranges, and the filter is at least one bandpass and/or at least one high-frequency rectifier circuit, and the filter is connected at an output of the filter to at least one analog/digital converter.

7. The subscriber station as recited in claim 1, wherein the interference processing unit is configured to adapt communication control by the communication control device by way of at least one of the following actions:
   reporting the interference with the message to at least one of the other subscriber stations in the bus system; and/or
   forgoing the transmission of lower-priority messages; and/or
   transmitting safety-relevant messages redundantly via a further communication channel or with a time offset; and/or
   adapting at least one bit timing parameter for the message depending on the detected interference; and/or
   not increasing a data rate after an arbitration phase for a CAN FD message, even though an error counter has not yet reached the threshold normally necessary therefor; and/or
   not reducing a maximum amplitude of a differential voltage for an LVCAN message and thus not increasing a data rate, even though an error counter has not yet reached a prespecified threshold therefor.

8. The subscriber station as recited in claim 1, wherein the interference processing unit is configured to report the interference with a message at least to a sensor that is connected to the subscriber station.

9. The subscriber station as recited in claim 1, further comprising:
   an error counter that is configured to add up separately, for each subscriber station of the bus system, at least one interference instance that is produced by transmission of the message with the transmission/reception device.

10. The subscriber station as recited in claim 1, further comprising:
    a reception error counter and a transmission error counter that are incremented or decremented depending on the kind of interference and/or a time of occurrence upon transmission of the message via the bus.

11. A bus system, comprising:
    a bus; and
    at least two subscriber stations which are connected to one another via the bus in such a way that they can communicate with one another, wherein each of the subscriber stations includes:
      a communication control device configured to control communication with at least one further subscriber station of the bus system;
      a transmission/reception device configured to receive a message from the bus, the message having been created by the communication control device or by the at least one further subscriber station of the bus system and is being transferred on the bus;
      an interference detection unit configured to detect interference in the context of transfer of the message on the bus; and
      an interference processing unit configured to evaluate the interference detected by the interference detection unit in terms of nature and magnitude of the interference, and to adapt communication control by the communication control device based on a result of the evaluation of the interference, wherein the at least two subscriber stations are configured to transmit data regarding the interference to a control center for use in a map that geographically depicts an EMC impact corresponding to the interference.

12. A method for data transfer in a serial bus system, in which at least two subscriber stations are connected to one another via a bus in such a way that they can communicate with one another, the method comprising the following steps:

serially receiving, with a transmission/reception device of one of the subscriber stations, a message from the bus which was created by a communication control device of the subscriber station or of the at least one further subscriber station of the bus system and is being transferred on the bus;

detecting, with an interference detection unit, interference in the context of transfer of the message on the bus;

evaluating, with an interference processing unit, the interference detected by the interference detection unit in terms of nature and magnitude of the interference; and adapting communication control by the communication control device to a result of the evaluation of the interference, wherein the subscriber station and the further subscriber station are configured to transmit data regarding the interference to a control center for use in a map that geographically depicts an EMC impact corresponding to the interference.

* * * * *